United States Patent [19]
Dableh et al.

[11] Patent Number: 4,639,544
[45] Date of Patent: Jan. 27, 1987

[54] PIPE-TYPE CABLE SYSTEM WITH ELECTROMAGNETIC FIELD SHAPER

[76] Inventors: Joseph H. Dableh, 806 Queensbridge Drive, Mississauga, Ontario, Canada, L5C 3K4; Raymond D. Findlay, 574 Tuscarora Road, Ancaster, Ontario, Canada, L9G 3N3

[21] Appl. No.: 761,537

[22] Filed: Aug. 1, 1985

[51] Int. Cl.[4] .......... H05K 9/00
[52] U.S. Cl. .......... 174/32; 174/24; 174/26 R
[58] Field of Search .......... 174/24, 26 R, 26 G, 174/27, 32, 35 CE

[56] References Cited

U.S. PATENT DOCUMENTS

| | | | |
|---|---|---|---|
| 1,833,648 | 10/1932 | Emanueli | 174/26 R |
| 2,340,081 | 1/1944 | Sauer | 174/35 CE |
| 2,433,181 | 12/1947 | White | 174/35 CE |
| 2,787,651 | 4/1957 | Lapsley | 174/32 |
| 3,160,702 | 12/1964 | Lapsley | 174/32 |
| 3,594,492 | 7/1971 | Bahder | 174/26 R X |
| 3,749,811 | 7/1973 | Bogner et al. | 174/27 X |

*Primary Examiner*—Arthur T. Grimley
*Assistant Examiner*—Morris H. Nimmo
*Attorney, Agent, or Firm*—Ridout & Maybee

[57] ABSTRACT

In an alternating current pipe-type cable system in which a group of individual insulated conductors are loosely disposed eccentrically within a conduit, an electromagnetic field shaping device interposed between the conductors and the conduit wall, so as to line the wall is configured so as to reduce eddy current losses in the conduit and in the conductors. The device is in the form of a slotted cylinder positioned so that the slot is diametrically opposite the group of conductors thereby to redistribute the magnetic flux induced. The device is preferably laminated in the radial and axial directions.

19 Claims, 10 Drawing Figures

PIPE-TYPE CABLE SYSTEM WITH ELECTROMAGNETIC FIELD SHAPER

This invention relates to alternating current pipe-type cable systems, that is, electric cable systems for transmitting alternating current at power frequencies. Such systems are commonly used for underground and submarine transmission of electric power at high voltages, and such a system typically comprises a group of individually insulated conductors extending side by side within a metallic conduit.

BACKGROUND OF THE INVENTION

Hitherto, alternating current losses have presented a serious problem in such cable systems. The losses arise from the fact that the a.c. resistance of electrical conductors increases when they are installed in a metallic enclosure. This increase is normally measured with reference to the a.c./d.c. resistance ratio. The various effects which contribute to the increases in a.c./d.c. ratio may be summarized as follows:

| Designation | Increase in a.c. Resistance due to: |
|---|---|
| $Y_{cs}$ | skin effect in-air |
| $Y_{cp}$ | proximity effect in-air |
| $Y_{se}$ | shield eddy current effect in-air |
| $Y_{sc}$ | shield circulating current effect in-air |
| $Y'_{cs}$ | skin effect in-pipe |
| $Y'_{cp}$ | proximity effect in-pipe |
| $Y'_{se}$ | shield eddy current effect in-pipe |
| $Y'_{sc}$ | shield circulating current effect in-pipe |
| $Y_p$ | pipe loss effect. |

In the case of a three-phase pipe-type cable system the a.c./d.c. resistance ratio is expressed by the equation $$\frac{R_{ac}}{R_{dc}} = 1 + Y'_{cs} + Y'_{cp} + Y'_{se} + Y'_{sc} + Y_p$$

where the prime signs denote that the skin effect, proximity effect, shield eddy current and shield circulating current are affected by the presence of the pipe. These effects are considerably greater than in the case of a three-phase cable system in air.

It is important to note that the change in a.c./d.c. resistance ratio due to the metallic enclosure depends upon a large number of parameters related to the design and materials of the cables, the design and materials of the enclosure, the cable configuration and the operating conditions. Extensive work has been carried out by many researchers to establish methods for reducing the a.c. resistance and consequently the electrical losses in such systems. However, in spite of some progress in this area, the reported methods to reduce the electrical losses offer only partial solutions to the problem since they address only a limited number of the relevant parameters. As a result, none of the reported methods offers sufficient improvement to justify the cost of its implementation on a commercial scale.

SUMMARY OF THE INVENTION

It is an object of the present invention to provide, in a pipe-type cable system, means for shaping the resultant electromagnetic fields in such a way as to reduce all of the effects contributing to the incremental parameters referred to above, that is to say, to reduce electrical losses resulting from a variety of effects.

The invention is especially applicable to systems operating at very high voltage and current levels where the losses become limiting parameters.

An important feature of the invention is that it provides a high degree of flexibility in selecting specific parameters and materials to suit any particular application and to optimize the cost/benefit ratio of the installation.

According to the present invention, in an electrical cable system for transmitting alternating current at power frequency, the system comprising a group of individually insulated conductors extending side by side within a metallic conduit, the conduit having a continuous interior wall and the conductors being disposed eccentrically within the conduit adjacent a first longitudinally extending region of said inner wall, there is provided a metallic liner interposed between the conductors and said wall, the liner having a longitudinal slot extending throughout its length, the slot being disposed adjacent a second longitudinally extending portion of the wall opposite said first portion.

Depending on the installation requirements the liner may be of ferromagnetic material or nonferromagnetic material.

One or more further liners may be interposed between the slotted liner and the wall of the conduit, thus providing a composite liner assembly which is laminated radially. One or more of the individual liners may be constituted by a series of rings abutting end to end and insulated from one another.

BRIEF DESCRIPTION OF THE DRAWINGS

In order that the invention may be readily understood, several embodiments thereof will now be described by way of example with reference to the accompanying drawings.

In the drawings.

EXAMINATION OF THE PROBLEM

Figure 1:
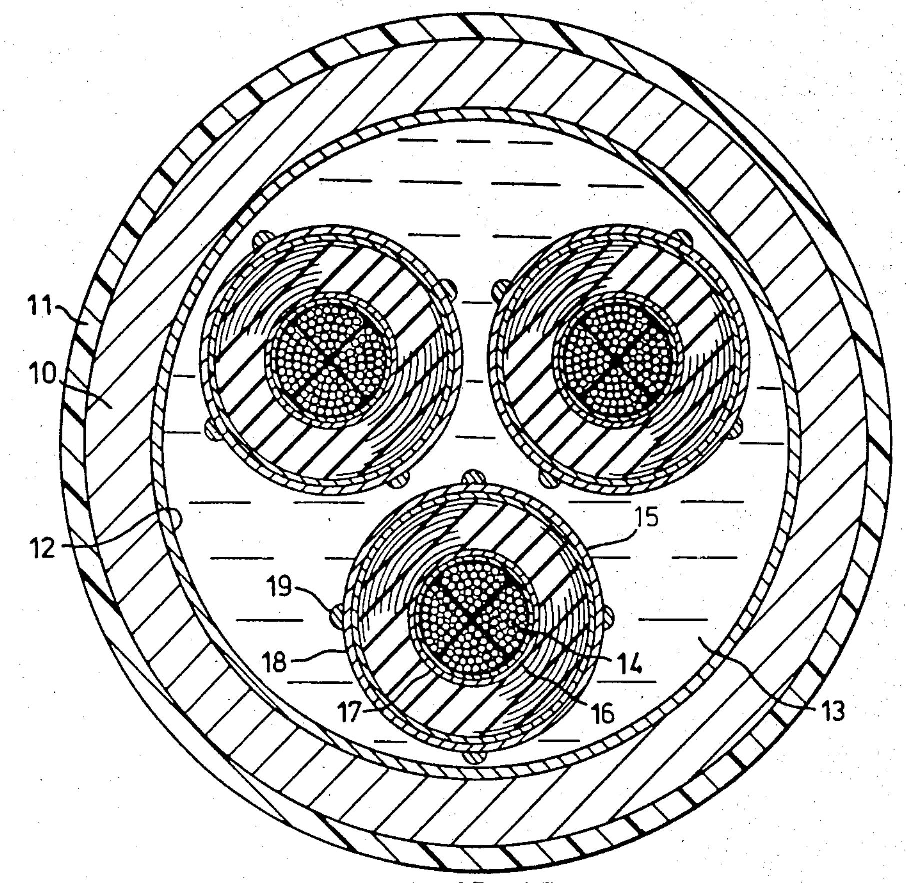
PRIOR ART FIG. 1
FIG. 1 is a cross-sectional view of a typical three-phase pipe-type cable system.

The main components of a typical three-phase pipe-type cable system are shown in FIG. 1. The metallic conduit 10, usually a steel pipe, is provided with an outer protective coating of coal tar or plastic 11, and an inner protective coating 12, the pipe being filled with insulating oil 13. Each of the three phase conductors 20 is a segmental conductor of tinned copper strands 14, taped in four segments, and encased in a conductive shield 15. Impregnated paper tape insulation 16 encloses the conductor core and this in turn is encased in a metallized plastic screen 17 protected by a moisture seal 18. Skids 19 are provided on each conductor assembly.

Figure 2A:
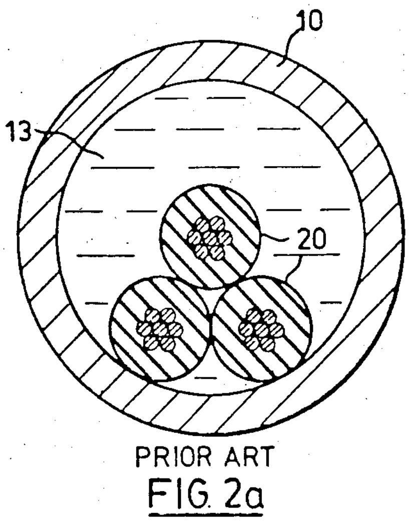
PRIOR ART FIG. 2a
FIG. 2*a* is a schematic representation of a typical three-phase pipe-type cable system wherein the conductors are eccentrically arranged in a triangular configuration.
Figure 2B:
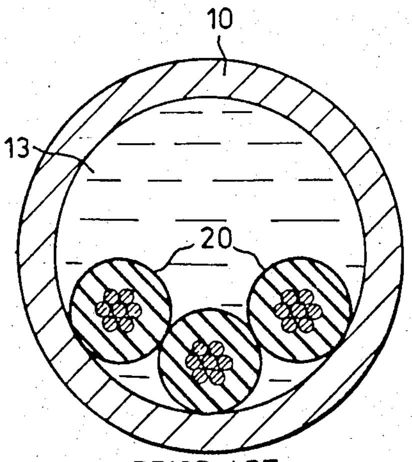
PRIOR ART FIG. 2b
FIG. 2*b* is a schematic representation of a typical three-phase pipe-type cable system wherein the conductors are eccentrically arranged in a cradle configuration.

In the cable system shown in FIG. 1 the conductors are disposed symmetrically in a triangular configuration, the conductors being located by spacers (not shown). In a practical system the conductors 20 are loosely disposed in a close triangular configuration as shown in FIG. 2*a*, or in a cradle configuration as shown in FIG. 2*b*, the conductors forming a group positioned eccentrically within the conduit. A third possibility, not illustrated, is the symmetrical open triangular configuration in which the conductors are located adjacent to the interior wall of the conduit. Of the three configurations the cradle configuration is the most practical as it does not require the use of spacers. On the other hand, the electrical losses associated with the cradle configuration are higher than those associated with the close triangular configuration, and so the present invention will afford maximum benefits with a system in which the conductors have the loose cradle configuration.

Typical a.c./d.c. resistance ratios for 115, 345 and 765 kV high pressure oil-filled (HPOF) cables, with various compact segmental conductors, in 0.203, 0.305 and 0.356 m carbon steel pipes, respectively, are given in Tables 1, 2 and 3. These tables also show the a.c./d.c. resistance ratios for a single phase cable and three-phase cables in close triangular and cradle formations in air (with no pipe present), to illustrate quantitatively the influence of the proximity effect and the presence of the pipe.

TABLE 1

Comparison of ac/dc Resistance Ratios for 115, 345 and 765 kV HPOF Cables with 3250 kcmil (1650 mm$^2$) Compact Segmental Aluminum Conductors in Carbon Steel Pipe @ 23° C.

| | 115 kV | | 345 kV | | 765 kV | |
|---|---|---|---|---|---|---|
| | Measured | Calculated | Measured | Calculated | Measured | Calculated |
| (a) Single Phase | | | | | | |
| $1 + Y_{cs}$ (skin effect) | 1.03 | 1.03 | 1.03 | 1.03 | 1.03 | 1.03 |
| (b) Close Triangular In-Air | | | | | | |
| $1 + Y_{cs} + Y_{cp} + Y_{se} + Y_{sc}$ | 1.05 | 1.05 | 1.05 | 1.04 | 1.04 | 1.04 |
| (c) Cradle In-Air | | | | | | |
| $1 + Y_{cs} + Y_{cp} + Y_{se} + Y_{sc}$ | 1.08 | 1.07 | 1.06 | 1.06 | 1.05 | 1.05 |
| (d) Close Triangular In-Pipe | | | | | | |
| $1 + Y'_{cs} + Y'_{cp} + Y'_{se} + Y'_{sc} + Y_p$ | 1.39 | 1.41 | 1.46 | 1.53 | 1.58 | 1.64 |
| (e) Cradle Formation in Pipe | | | | | | |
| $1 + Y'_{cs} + Y'_{cp} + Y'_{se} + Y'_{sc} + Y_p$ | 1.56 | 1.57 | 1.66 | 1.68 | 1.70 | 1.79 |

TABLE 2

Comparison of ac/dc Resistance Ratios for 115, 345 and 765 kV HPOF Cables with 3250 kcmil (1650 mm$^2$) Compact Segmental Tin-Coated Copper Conductors in Carbon Steel Pipe @ 23° C.

| | 115 kV | | 345 kV | | 765 kV | |
|---|---|---|---|---|---|---|
| | Measured | Calculated | Measured | Calculated | Measured | Calculated |
| (a) Single Phase | | | | | | |
| $1 + Y_{cs}$ (skin effect) | 1.17 | 1.17 | 1.17 | 1.17 | 1.17 | 1.17 |
| (b) Close Triangular In-Air | | | | | | |
| $1 + Y_{cs} + Y_{cp} + Y_{se} + Y_{sc}$ | 1.29 | 1.25 | 1.21 | 1.21 | 1.19 | 1.20 |
| (c) Cradle In-Air | | | | | | |
| $1 + Y_{cs} + Y_{cp} +0\ Y_{se} + Y_{sc}$ | 1.32 | 1.38 | 1.29 | 1.27 | 1.28 | 1.24 |
| (d) Close Triangular In-Pipe | | | | | | |
| $1 + Y'_{cs} + Y'_{cp} + Y'_{se} + Y'_{sc} + Y_p$ | 1.89 | 1.85 | 1.91 | 2.06 | 2.11 | 2.22 |
| (e) Cradle Formation In-Pipe | | | | | | |
| $1 + Y'_{cs} + Y'_{cp} + Y'_{se} + Y'_{sc} + Y_p$ | 2.21 | 2.28 | 2.23 | 2.35 | 2.47 | 2.51 |

TABLE 3

Comparison of ac/dc Resistance Ratios for 115, 345 and 765 kV HPOF Cables with 3500 kcmil (1776 $mm^2$) Compact Segmental Enamel Coated Copper Conductors in Carbon Steel Pipe @ 23° C.

| | 115 kV | | 345 kV | | 765 kV | |
|---|---|---|---|---|---|---|
| | Measured | Calculated | Measured | Calculated | Measured | Calculated |
| (a) Single Phase | | | | | | |
| $1 + Y_{cs}$ (skin effect) | 1.10 | 1.10 | 1.10 | 1.10 | 1.10 | 1.10 |
| (b) Close Triangular In-Air | | | | | | |
| $1 + Y_{cs} + Y_{cp} + Y_{se} + Y_{sc}$ | 1.14 | 1.15 | 1.13 | 1.13 | 1.12 | 1.12 |
| (c) Cradle In-Air | | | | | | |
| $1 + Y_{cs} + Y_{cp} + Y_{se} + Y_{sc}$ | 1.19 | 1.19 | 1.16 | 1.16 | 1.15 | 1.16 |
| (d) Close Triangular In-Pipe | | | | | | |
| $1 + Y'_{cs} + Y'_{cp} + Y'_{se} + Y'_{sc} + Y_p$ | 1.75 | 1.81 | 1.96 | 2.04 | 2.13 | 2.24 |
| (e) Cradle Formation In-Pipe | | | | | | |
| $1 + Y'_{cs} + Y'_{cp} + Y'_{se} + Y'_{sc} + Y_p$ | 2.08 | 2.11 | 2.48 | 2.44 | 2.62 | 2.65 |

One well known method of reducing the a.c./d.c. resistance ratio of pipe-type cable systems is to use pipes made of nonferromagnetic material such as aluminium or stainless steel.

Table 4, below, provides the a.c./d.c. resistance ratios for cable systems identical to those described in Table 1, but enclosed in stainless steel pipes instead of carbon steel pipes. Table 5 provides a similar comparison for cables with compact segmental copper conductors of two different sizes, and Table 6 gives the same information for cables with aluminium conductors.

TABLE 5-continued

Comparison of ac/dc Resistance Ratios of Cables having Compact Segmental Copper Conductors Tin-coated in Carbon Steel & Stainless Steel Pipes @ 23° C. (calculated)

| | Voltage Spacing (kV) | | | | | |
|---|---|---|---|---|---|---|
| | 115 | | 345 | | 765 | |
| Pipe Material* | C.S | S.S. | C.S. | S.S. | C.S. | S.S. |
| Cradle | 2.28 | 1.82 | 2.35 | 1.92 | 2.51 | 2.05 |

*C.S. - Carbon Steel
S.S. - Stainless Steel

TABLE 4

Comparison of ac/dc Resistance Ratios for 115, 345 and 765 kV HPOF Cables with 3250 kcmil (1650 $mm^2$) Compact Segmental Aluminum Conductors in Stainless Steel Pipe @ 23° C.

| | 115 kV | | 345 kV | | 765 kV | |
|---|---|---|---|---|---|---|
| | Measured | Calculated | Measured | Calculated | Measured | Calculated |
| (a) Single Phase | | | | | | |
| $1 + Y_{cs}$ (skin effect) | 1.03 | 1.03 | 1.03 | 1.03 | 1.03 | 1.03 |
| (b) Close Triangular In-Air | | | | | | |
| $1 + Y_{cs} + Y_{cp} + Y_{se} + Y_{sc}$ | 1.05 | 1.05 | 1.05 | 1.05 | 1.05 | 1.05 |
| (c) Cradle In-Air | | | | | | |
| $1 + Y_{cs} + Y_{cp} + Y_{se} + Y_{sc}$ | 1.08 | 1.07 | 1.06 | 1.06 | 1.05 | 1.05 |
| (d) Close Triangular In-Pipe | | | | | | |
| $1 + Y'_{cs} + Y'_{cp} + Y'_{se} + Y'_{sc} + Y_p$ | 1.22 | 1.23 | 1.30 | 1.32 | 1.38 | 1.41 |
| (e) Cradle Formation In-Pipe | | | | | | |
| $1 + Y'_{cs} + Y'_{cp} + Y'_{se} + Y'_{sc} + Y_p$ | 1.35 | 1.35 | 1.48 | 1.45 | 1.50 | 1.55 |

TABLE 5

Comparison of ac/dc Resistance Ratios of Cables having Compact Segmental Copper Conductors Tin-coated in Carbon Steel & Stainless Steel Pipes @ 23° C. (calculated)

| | Voltage Spacing (kV) | | | | | |
|---|---|---|---|---|---|---|
| | 115 | | 345 | | 765 | |
| Pipe Material* | C.S | S.S. | C.S. | S.S. | C.S. | S.S. |
| Configuration | 2000 kcmil (1015 $mm^2$) | | | | | |
| Close Triangular | 1.42 | 1.28 | 1.52 | 1.35 | 1.64 | 1.42 |
| Cradle | 1.64 | 1.44 | 1.78 | 1.51 | 1.95 | 1.59 |
| | 3250 kcmil (1650 $mm^2$) | | | | | |
| Close Triangular | 1.85 | 1.51 | 2.06 | 1.66 | 2.22 | 1.80 |

TABLE 6

Comparison of ac/dc Resistance Ratios of Cables having Compact Segmental Aluminum Conductors in Carbon Steel & Stainless Steel Pipes @ 23° C. (calculated)

| | Voltage Spacing (kV) | | | | | |
|---|---|---|---|---|---|---|
| | 115 | | 345 | | 765 | |
| Pipe Material* | C.S. | S.S. | C.S. | S.S. | C.S. | S.S. |
| Configuration | 2000 kcmil (1015 $mm^2$) | | | | | |
| Close Triangular | 1.22 | 1.13 | 1.31 | 1.19 | 1.38 | 1.23 |
| Cradle | 1.35 | 1.21 | 1.41 | 1.28 | 1.49 | 1.33 |
| | 3250 kcmil (1650 $mm^2$) | | | | | |
| Close Triangular | 1.41 | 1.23 | 1.53 | 1.32 | 1.64 | 1.41 |

TABLE 6-continued

Comparison of ac/dc Resistance Ratios of Cables having Compact Segmental Aluminum Conductors in Carbon Steel & Stainless Steel Pipes @ 23° C. (calculated)

| | Voltage Spacing (kV) | | | | | |
|---|---|---|---|---|---|---|
| | 115 | | 345 | | 765 | |
| Pipe Material* | C.S. | S.S. | C.S. | S.S. | C.S. | S.S. |
| Cradle | 1.57 | 1.35 | 1.68 | 1.45 | 1.79 | 1.54 |

*C.S. - Carbon Steel
S.S. - Stainless Steel

Figure 3:
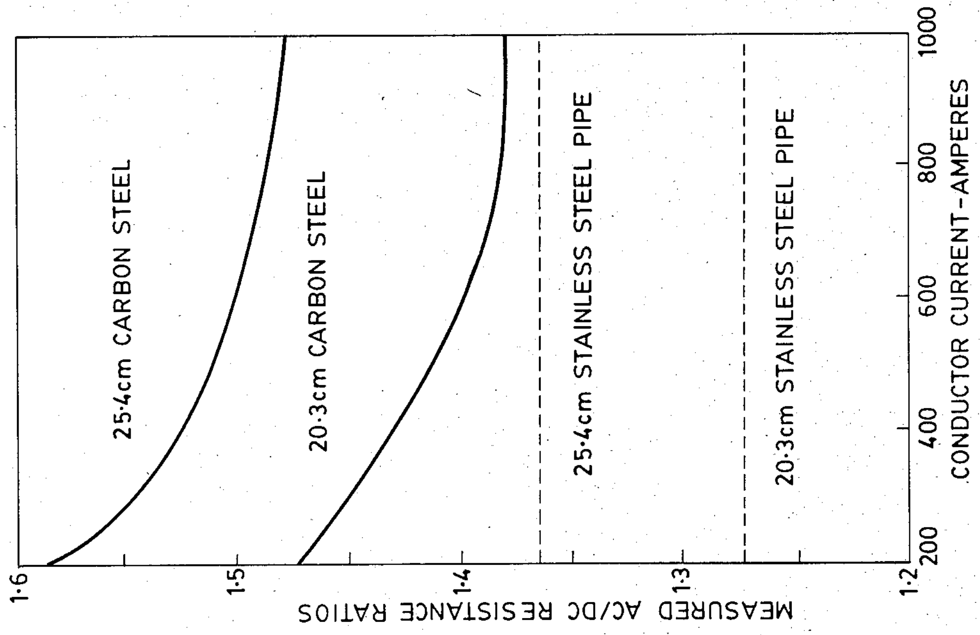
FIG. 3 is a diagram showing variation of measured a.c/d.c. resistance ratio with conductor current for different pipe materials.

FIG. 3 is a diagram in which the a.c/d.c. resistance ratio is plotted against current for cable systems in which the conduits are of carbon steel and for cable systems in which the conduits are of stainless steel. It will be noted that, in the former case, the ratio decreases as the current increases, whereas in the latter case the ratio remains constant. It follows that the advantages of using stainless steel conduits at high current levels are much smaller than those indicated by Tables 5 and 6.

The use of special pipes such as those known by the trade mark "Dunlopipe" or pipes equipped with high permeability liners do not offer any larger reductions than those achieved by using stainless steel pipes, as illustrated in Tables 7 and 8. Also, the use of a separate pipe for each cable of a three phase system has lower losses only when non-magnetic pipes are used with very wide spacing. These restrictions impose a severe economic penalty on their use.

TABLE 7

Comparison of Measured ac/dc Resistance Ratios for 2000 kcmil (1015 mm$^2$) Compact Segmental Tin-Coated Copper Conductors in Dunlopipe, Stainless and Carbon Steel Pipes

| | 115 kV | | | 345 kV | | |
|---|---|---|---|---|---|---|
| Pipe Type | D. | C.S. | S.S. | D. | C.S. | S.S. |
| Configuration | | | | | | |
| Triangular | 1.35 | 1.42 | 1.27 | 1.36 | 1.52 | 1.36 |
| Cradle | 1.58 | 1.63 | 1.40 | 1.59 | 1.78 | 1.52 |

D - Dunlopipe
C.S. - Carbon Steel
S.S. - Stainless Steel

TABLE 8 ac/dc Resistance Ratios of 2000 kcmil (1015 mm$^2$) Tin-Coated Copper Conductor 345 kV Cables in 10 inch (25.4 cm) Carbon Steel Pipe with Grain Oriented M-6 Silicon Steel Pipe Liner at 800 A

| | ac/dc Resistance Ratio* |
|---|---|
| Rolling Direction Parallel to Pipe Axis | 1.41 |
| Rolling Direction Perpendicular to Pipe Axis | 1.27 |
| No Liner in Pipe (Typical) | 1.53 |

The foregoing discussion summarizes the state of the art on known methods used to reduce a.c./d.c. resistance ratios in pipe-type cable systems. The information may be used to establish a base line reference for the parameters involved.

DESCRIPTION OF THE PREFERRED EMBODIMENTS

The present invention is based on the concept of using a field shaper, that is, a device which modifies the electromagnetic fields set up in a pipe-type cable system in such a way as to reduce the a.c./d.c. resistance ratio. The field shaper can take various forms, illustrated in FIGS. 4, 5, 6 and 7 of the accompanying drawings, according to operating requirements. These specific forms will first be described and their effects will be subsequently discussed.

Figure 4A:
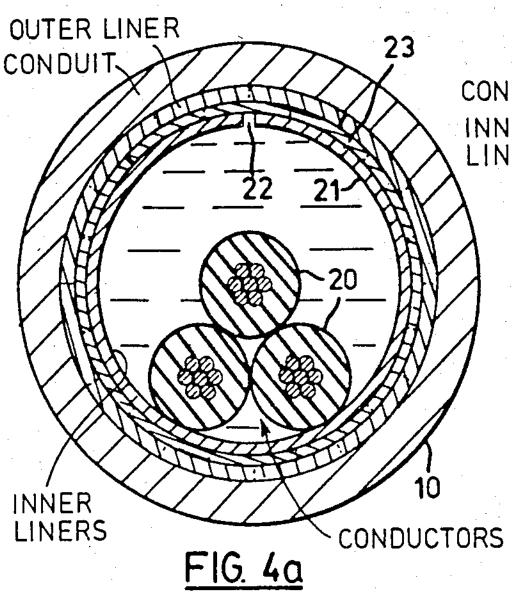
FIG. 4*a* is a view corresponding to FIG. 2*a* of a cable system according to the present invention, the conductors being arranged eccentrically in a triangular configuration.
Figure 4B:
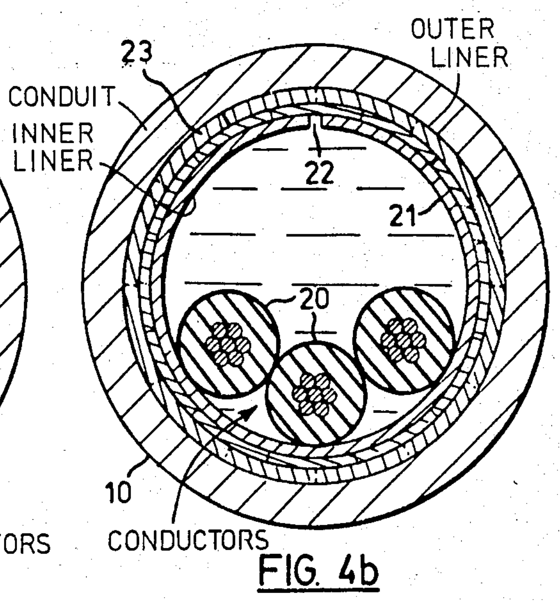
FIG. 4*b* is a view similar to FIG. 3*a* but showing the conductors in a cradle configuration.

FIG. 4*a* shows a field shaper used in a cable system in which the conductors 20 are loosely disposed in a close triangular configuration, eccentric to the conduit 10. FIG. 4*b* shows the same field shaper used in a cable system in which the conductors are disposed in a cradle configuration. In each case the conduit 10 is cylindrical and has a continuous interior wall, the group of conductors 20 lying adjacent a longitudinally extending bottom region of the wall. A first metallic liner 21 is interposed between the conductors 20 and the wall of the conduit 10, this liner 21 being in the form of split cylinder providing a longitudinal slot 22 extending throughout its length. This slot 22 defines a longitudinal groove diametrically opposite the bottom region of the pipe where the conductors lie. The liner 21 may be of ferromagnetic material, such as carbon steel, the slot 22 defining a region of concentrated magnetic flux. Alternatively, the liner 21 may be of nonferromagnetic material for certain applications, the slot 22 defining a region of concentrated magnetic flux resulting from induced eddy currents.

Figure 5:
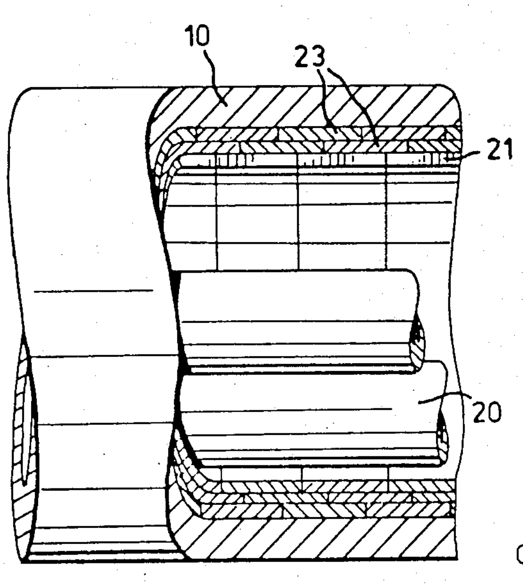
FIG. 5 is a longitudinal sectional view of the cable system shown in FIG. 4*a;*

The liner 21 may lie directly against the interior wall of the conduit 10, but in the preferred embodiments shown in FIGS. 4*a* and 4*b* one or more additional metal liners 23 are interposed between the liner 21 and the wall. These additional liners, of ferromagnetic or nonferromagnetic metal, are each preferably constituted by split rings as shown in FIG. 5. The rings abut end to end and are insulated from one another, thus providing a liner assembly which is laminated in the axial direction. As shown in FIGS. 4*a* and 4*b*, the splits of the rings are staggered circumferentially in relation to one another. Furthermore, the rings of adjacent liners 23 are staggered longitudinally in relation to one another as shown in FIG. 5.

Figure 6:
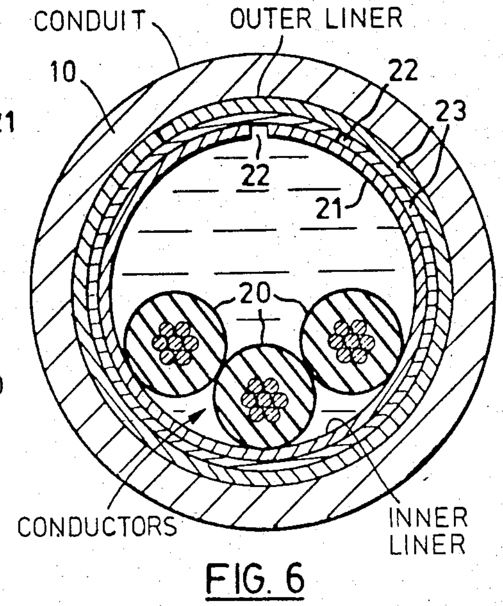
FIG. 6 is a cross-sectional view of yet another cable system according to the invention.

FIG. 6 illustrates in cross section yet another arrangement in which a plurality of the slotted liners 21 are arranged concentrically with their respective grooves 22 staggered circumferentially in relation to one another.

Figure 7:
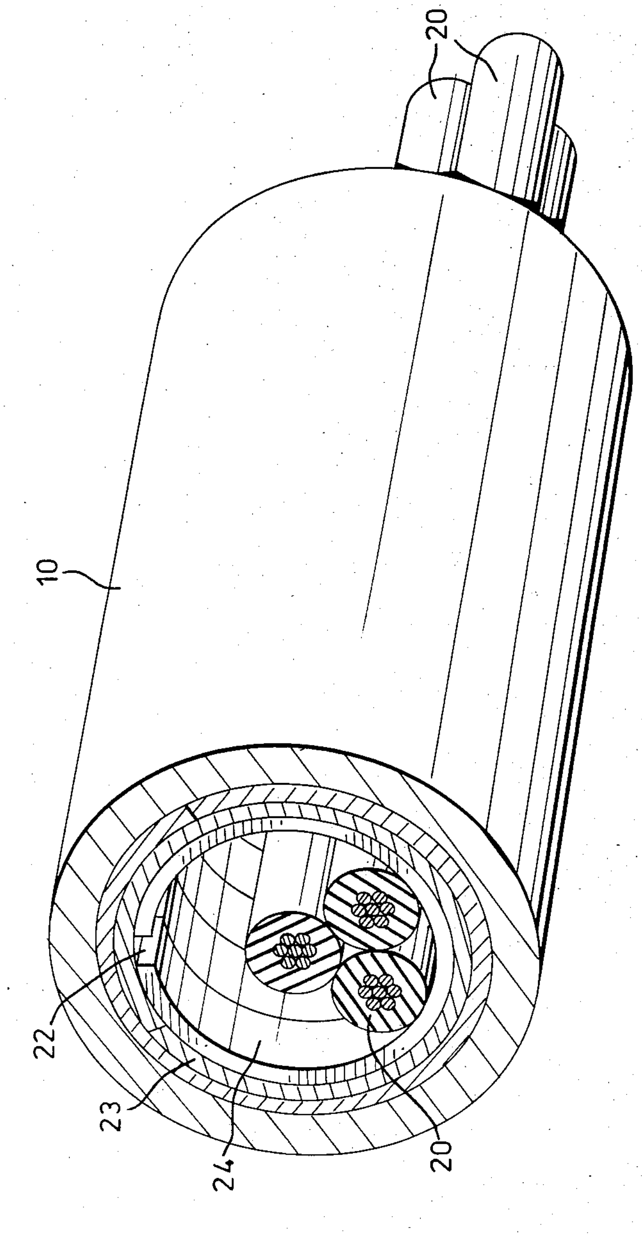
FIG. 7 is a fragmentary perspective view of yet another cable system in accordance with the present invention.

The cable system illustrated in FIG. 7 is essentially similar to that of FIG. 4*a*, but the slotted liner 21 is itself composed of a series of split rings 24 abutting end to end and insulated from one another, the splits of the rings 24 being longitudinally aligned to define the groove or slot 22.

Each of the electromagnetic field shapers described above with reference to the drawings has a direct influence on every component of the electrical losses in a pipe-type cable system. The incremental parameters of the a.c./d.c. resistance ratio expressed in the equation $$\frac{R_{ac}}{R_{dc}} = 1 + Y'_{cs} + Y'_{cp} + Y'_{se} + Y'_{sc} + Y_p$$

can be divided into two main categories as follows:

(a) Terms that are associated with the losses in the cables ($Y'_{cs}$, $Y'_{cp}$, $Y'_{se}$, $Y'_{sc}$).

(b) Terms that are associated with the losses in the pipe ($Y_p$).

In the case of a pipe-type cable system, the cable losses caused by the skin and proximity effects in the conductors of the cables are much larger than the losses caused by the eddy current and circulating current in the shields of the cables. The losses in a pipe made of magnetic material are composed of eddy current losses and hysteresis losses. While the lamination of the field shaper, in both the radial and axial directions, would affect mainly the pipe losses, the use of one or more longitudinally grooved layers would affect mainly the cable losses, by establishing a more uniform eddy current distribution in the circumferential direction. This would also reduce the pipe losses. The combined effects of the laminar construction and grooved layers will eliminate the hysteresis losses in the pipe in addition to the loss reduction achieved by using each layer separately. Estimates of the reduction in each of the above loss terms due to the three aspects of the field shaper (grooved layer(s), radial lamination and axial lamination) will be discussed separately for clarity. Then the total loss reduction will be derived taking into consideration various system configurations and operating conditions.

Reduction of the Losses due to One or More Grooved Layers

The main contribution of the field shaper to the reduction of cable losses associated with the skin and proximity effects is achieved mainly by the grooved layers and the lamination in the axial direction. Since the air gap has much higher reluctance than the reluctance of the metallic path, the grooved layers have the effect of diverting the magnetic flux from the vicinity of the conductor to the pipe section close to the slot in the rings. For example, in the case of cradle or close triangular arrangements the bottom half of the pipe has a very dense magnetic flux distribution which causes high induced current in that section of the pipe. Placing the slot of the rings of a grooved layer near the middle of the upper half of the pipe helps to achieve a more uniform flux distribution and consequently more uniform eddy-current density in the circumferential direction of the pipe. This is equivalent to placing the cables near the centre of the pipe and to increasing the spacing between the cables. Therefore, reduction in the cable and pipe losses are equivalent to the reduction achieved by going from cradle or close triangular arrangement (near the bottom of the pipe) to an open triangular arrangement near the centre of the pipe.

Figure 8:
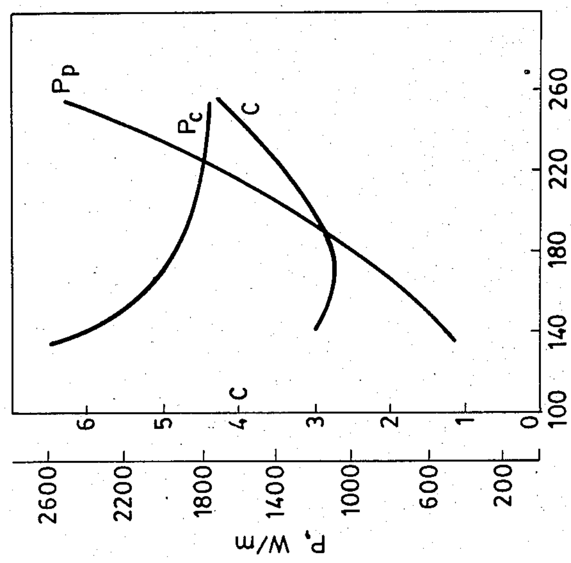
FIG. 8 is a diagram showing change in electrical losses as a function of conductor position.

The total conductor losses ($P_c$) and pipe losses ($P_p$) are highly dependent on the distance between the cables and the distance between the cables and the pipe. To illustrate this relationship, reference is made to the graph of FIG. 8. The coefficient (C), shown in FIG. 8, is defined as:

$$C = (P_c + P_p)\frac{s\sigma_c}{3I^2} \quad (2)$$

where s is the cross-section of the cable conductor, $\sigma_c$ is the conductivity of the conductor and I is the magnitude of the current.

In most practical applications the pipe losses are much higher than the conductor losses, especially in cradle configurations, since all three conductors are very close to the pipe. It can be seen from FIG. 8 that the range of variation in the pipe losses is very large (400 to 2600 w/m), while the variation in the total conductor losses is approximately 30% (1800 to 2600 w/m). In addition to the above data, results of other cases are presented in Tables 9 to 13, to illustrate the individual contribution of the cables' proximity and skin effects and the pipe-to-cables proximity effect. The symbol $Y_{pp}$ is used to express the pipe proximity effect on conductors.

TABLE 9 ac/dc Resistance Ratios for 760 mm$^2$ (1500 kcmil), Concentric Copper Conductor in Triangular Configuration Inside a Steel Pipe of 0.13 m Diameter

| Quantity | Calculations* | Measurements |
|---|---|---|
| $1 + Y_{cs}$ | 1.19 | 1.19 |
| $1 + Y_{cs} + Y_{cp}$ | 1.54 | 1.51 |
| $Y_{pp}$ | 0.11 | — |
| $Y_p$ | 0.20 | — |
| $R_{ac}/R_{dc}$ | 1.85 | 1.88 |

*Conductor radius = 0.0155 m.
Center to center distance = 0.0432 m.
Pipe radius = 0.064 m, $\sigma_c = 5.794 \times 10^7$ ohm$^{-1}$ m$^{-1}$, $\sigma_p = 8.104 \times 10^6$ ohm$^{-1}$ m$^{-1}$.

TABLE 10 ac/dc Resistance Ratios for 1270 mm$^2$ (2500 kcmil), Concentric Copper Conductor in Triangular Configuration Inside a Steel Pipe of 0.16 m Diameter

| Quantity | Calculations* | Measurements |
|---|---|---|
| $1 + Y_{cs}$ | 1.45 | 1.48 |
| $1 + Y_{cs} + Y_{cp}$ | 2.01 | 1.93 |
| $Y_{pp}$ | 0.18 | — |
| $Y_p$ | 0.41 | — |
| $R_{ac}/R_{dc}$ | 2.62 | 2.64 |

*Conductor radius = 0.02 m.
Center to center distance 0.055 m.
Pipe radius = 0.0783 m, $\sigma_c = 5.952 \times 10^7$ ohm$^{-1}$ m$^{-1}$, $\sigma_p = 7.837 \times 10^6$ ohm$^{-1}$ m$^{-1}$.

TABLE 11 ac/dc Resistance Ratios for 1270 mm$^2$ (2500 kcmil), Concentric Copper Conductor in Cradle Configuration Inside a Steel Pipe of 0.16 m Diameter

| Quantity | Calculations* | Measurements |
|---|---|---|
| $Y_{cs}$ | 1.45 | 1.48 |
| $1 + Y_{cs} + Ycp$ | 1.96 | 2.03 |
| $Y_{pp}$ | 0.32 | — |
| $Y_p$ | 0.66 | — |
| $R_{ac}/R_{dc}$ | 2.94 | 2.98 |

*Conductor radius = 0.02 m.
Center to center distance of adjacent cables = 0.055 m.
Pipe radius = 0.0783 m, $\sigma_c = 5.952 \times 10^7$ ohm$^{-1}$ m$^{-1}$, $\sigma_p = 7.837 \times 10^6$ ohm$^{-1}$ m$^{-1}$

TABLE 12

Comparison of Calculated and Measured Contributions of a Magnetic Pipe to the ac/dc Resistance Ratios. Cables with 2000 kcmil Stranded, Segmental Copper Conductors

| | 115 kV | | 345 kV | | 765 kV | |
|---|---|---|---|---|---|---|
| | Measured | Calculated | Measured | Calculated | Measured | Calculated |
| Triangular | | | | | | |
| $Y_{pp}$ | | 0.02 | | 0.01 | | 0.00 |
| $Y_p$ | | 0.26 | | 0.40 | | 0.47 |
| $Y_{pp} + Y_p$ | 0.25 | 0.28 | 0.39 | 0.41 | 0.53 | 0.47 |
| Cradle | | | | | | |
| $Y_{pp}$ | | 0.03 | | 0.01 | | 0.00 |
| $Y_p$ | | 0.45 | | 0.62 | | 0.70 |
| $Y_{pp} + Y_p$ | 0.40 | 0.48 | 0.61 | 0.63 | 0.80 | 0.70 |

TABLE 13

Comparison of Calculated and Measured Contributions of a Magnetic Pipe to the ac/dc Resistance Ratios, Cables with 3500 kcmil Stranded, Segmental Copper Conductors

| | 115 kV | | 345 kV | | 765 kV | |
|---|---|---|---|---|---|---|
| | Measured | Calculated | Measured | Calculated | Measured | Calculated |
| Triangular | | | | | | |
| $Y_{pp}$ | | 0.06 | | 0.04 | | 0.03 |
| $Y_p$ | | 0.62 | | 0.91 | | 1.02 |
| $Y_{pp} + Y_p$ | 0.68 | 0.68 | 0.85 | 0.95 | 0.97 | 1.05 |
| Cradle | | | | | | |
| $Y_{pp}$ | | 0.08 | | 0.05 | | 0.03 |
| $Y_p$ | | 0.87 | | 1.13 | | 1.24 |
| $Y_{pp} + Y_p$ | 0.93 | 0.95 | 1.31 | 1.18 | 1.40 | 1.27 |

Comparison of $Y_{pp}$ in Tables 10 and 11 shows that this parameter increased from 0.18 to 0.32 (78%) by merely moving one cable from near the centre of the pipe (close triangular) to the inner surface of the pipe (cradle configuration). This is indicative of the potential margin of saving if the reverse operation is performed, i.e. if all three cables in cradle configuration are effectively spaced away from the wall of the pipe. Similar results would be achieved if instead of moving the conductor physically, the magnetic flux generated by their current is redistributed more evenly by the grooved layer or layers of the field shaper. Therefore, a reduction of at least 60% in the relative value or $Y_{pp}$ can be achieved by the grooved layer, for any cable dimensions in cable configurations which are disposed eccentrically with respect to the centre of the pipe. Higher reduction in the case of cradle configuration is possible.

From the results summarized in FIG. 8 for the pipe losses and by comparing the pipe losses in the cradle and close triangular configurations (where applicable) in the above tables, one can provide the following estimates for possible reductions in pipe losses:

(a) In the case of cradle configuration $Y_p$ can be reduced by a factor of three.

(b) In the case of close triangular configuration $Y_p$ can be reduced by a factor of two, since only two cables are touching the wall of the pipe.

(c) In the case of open triangular configuration (where the three cables are positioned against the pipe wall to form an equilateral triangle), $Y_p$ can be reduced by a factor of three if three grooved layers are used (with the slot of each layer located at half distance between two cables).

The conductor losses due to skin and proximity effects are reduced to a much lesser extent than the pipe losses since the magnetic flux path is mostly non-metallic (the oil filling the pipe) and partially metallic (the pipe wall). Therefore, a reduction in the order of 20% can be achieved for close triangular configuration and 30% for cradle configuration.

Reduction of the Losses Due to Radial Lamination

The effect of laminating the pipe wall in the radial direction may be illustrated by comparing this case with that of an iron plate shielded by an aluminium plate, a flat plate being treated as a cylinder of infinite radius.

Measurements have been made on (a) the distribution of the magnetic flux in the iron plate without the aluminium plate shielding it; and (b) the magnitude of the eddy current in the aluminium plate.

The effect of eddy current shielding by the aluminium plate is illustrated in Table 14.

TABLE 14

Effect of Eddy Current Shielding by Aluminium Plate

| | A | B | C | B + C | (B + C)/A |
|---|---|---|---|---|---|
| Total Loss (w/m) | 673 | 2 | 190 | 192 | 0.29 |
| Maximum Loss Amount (w/m) | 945 | 2 | 193 | 195 | 0.21 |

where
A: Iron plate without shield
B: Iron plate with eddy current shielding by aluminium plate.
C: Aluminium plate for eddy current shielding.

Calculations confirmed by measurement show that in spite of subjecting the plate to a dense electromagnetic field distribution, the total loss was reduced to less than a third. Hence it may be deduced that a similar reduction can be achieved for pipe-type cables by using a single shielding layer, and higher reductions can be realized by using more than one layer.

Radial lamination contributes to the reduction of the losses associated with the proximity of the pipe to the cables ($Y_{pp}$) and the conductor losses as well as to the reduction of pipe losses. The reduction in $Y_{pp}$ is evident since the pipe influence would be equivalent to that of a pipe made of non-magnetic material (see Tables 7 and 8). For the same reason, the influence of the iron pipe on the losses associated with the skin and proximity effects among the cables themselves is reduced. Approximate expressions to compare the influence of pipe material on these loss components are:

$$W = (1 + Y'_{cs} + Y'_{cp})3\,\rho_c\frac{I^2}{S}$$

for a pipe made of nonmagnetic material and $$W = (1 + 1.7\,(Y'_{cs} + Y'_{cp}))3\,\rho_c\frac{I^2}{S}$$

for a pipe made of magnetic material.

Therefore, using the field shaper will result in reducing the multiplying factor of 1.7 in the above equation to a negligible value.

The choice of the field shaper material is not restricted to non-magnetic material. It can be made of magnetic materials, with certain advantages for particular applications. Reduction in losses can be achieved by properly selecting the thickness and materials properties for the shield layer. Results of a case study involving eddy current loss in two magnetic materials with different thicknesses and electrical conductivities are shown below. These results represent substantiating evidence to the claim that a field shaper reduces losses. Table 15 shows the power loss associated with eddy current ($P_{ec}$) for various magnetic field densities (B).

TABLE 15

Parameters and Calculated Unidirectional 60 Hz Flux Losses for the Two Materials Studied Here

| LCS<br>Thickness = 0.74 mm<br>Resistivity = 15 μΩ-cm<br>Density = 7.85 g/cm³ | | M22<br>Thickness = 0.46 mm<br>Resistivity = 50.8 μΩ-cm<br>Density = 7.65 g/cm³ | |
|---|---|---|---|
| $B_{ave,peak}$ (T) | $P_{ec}$ (watts/kg) | $B_{ave,peak}$ (T) | $P_{ec}$ (watts/kg) |
| .8 | 1.62 | .8 | 0.203 |
| 1.0 | 2.62 | 1.0 | 0.318 |
| 1.2 | 3.96 | 1.2 | 0.457 |

TABLE 15-continued

| Parameters and Calculated Unidirectional 60 Hz Flux Losses for the Two Materials Studied Here | | | |
|---|---|---|---|
| LCS | | M22 | |
| Thickness = 0.74 mm | | Thickness = 0.46 mm | |
| Resistivity = 15 μΩ-cm | | Resistivity = 50.8 μΩ-cm | |
| Density = 7.85 g/cm$^3$ | | Density = 7.65 g/cm$^3$ | |
| $B_{ave,peak}$ (T) | $P_{ec}$ (watts/kg) | $B_{ave,peak}$ (T) | $P_{ec}$ (watts/kg) |
| 1.5 | 6.46 | 1.5 | 0.708 |
| 1.8 | 9.25 | 1.8 | 1.002 |
| 2.0 | 11.43 | 2.0 | 1.225 |

The results show that a reduction in the power loss (in the laminae) may be made of the order of 90% by selecting thinner, less conductive material.

Reduction of the Losses Due to Axial Lamination

The main objective of the laminating in the axial direction is to reduce the length of the eddy current path with a consequent decrease in the losses. Since the individual rings of the liners are insulated electrically from each other, the current induced in each ring is limited by the fact that the induced voltage is relatively low. Such is not the case for non-laminated pipe. The amount of loss reduction for laminating depends on the width of the rings, the number of layers and the width of the overlap joint.

The influence of eddy currents on the magnetic field distribution in the neighbourhood of mitered joints in laminated cores has been studied. The results of the study have confirmed that the maximum local value of specific losses remains about the same when the overlap length is varied, although their spatial distribution changes. However, the volume of lamination displaying higher localized losses near the air gaps (between two adjacent rings) becomes smaller as the overlap length is decreased. Therefore, the total losses decrease as the overlap length decreases.

In the case of a pipe-type cable system, the axial lamination contributes to the reduction of the conductor losses as well. As discussed previously, the losses attributed to the proximity effect are reduced by reducing the amount of induced current and by reducing the magnetic flux density near the conductors. However, the amount of loss reduction achieved by the axial lamination is much less than the reduction achieved by radial lamination. It is estimated that a reduction in the range of 20 to 40% in $Y_p$ and 10 to 25% in $Y_{pp}$, $Y'_{cs}$ and $Y'_{cp}$ can be achieved depending on the field shaper design.

Total Reduction of the Losses

In addition to the sum of the loss reductions discussed above, there exist other reductions that are achieved by the integration of the grooved layers, radial lamination and axial lamination. These reductions are related to the hysteresis and magnetization losses and to additional increases in the a.c. resistance of the system due to the thermal cycling of the cables.

To illustrate the magnitude of losses related to hysteresis and average permeability the results of a theoretical case study are presented in Table 16 for the following system:

| | |
|---|---|
| I (rms) = | 1540 A at 60 Hz |
| inner radius of the pipe = | 10.8 cm |
| outer cable diameter = | 10 cm |
| pipe thickness = | 3.5 cm |
| distance between centres of conductors = | 10 cm |
| distance between centre of the pipe and centre of centre of a conductor = | 5.8 cm. |

The permeability of the pipe was taken between 770 and 1400 (770 for maximum magnetic induction of 1.39 T and 1400 for the linear part of the magnetization curve).

TABLE 16

| Theoretical Calculation of Pipe Losses at 60 Hz | | | | |
|---|---|---|---|---|
| | AVERAGE PERMEABILITY | | | |
| PIPE LOSSES | 800 | 1000 | 1200 | 1400 |
| Eddy Current Loss w/cm | 0.625 | 0.572 | 0.535 | 0.503 |
| Hysteresis Loss w/cm | 0.108 | 0.084 | 0.063 | 0.043 |
| Total Pipe Loss w/cm | 0.733 | 0.656 | 0.598 | 0.546 |

By eliminating the hysteresis losses and by operating below the magnetic saturation level of the pipe material (due to the use of the field shaper), the pipe losses can be reduced from 0.733 to 0.546 w/cm (26%).

Although the a.c./d.c. resistance ratio of some pipe-type cable systems decreases as the temperature of the system increases, this ratio at 23° C. increases when the cables are returned to that temperature. The increase in the a.c./d.c. resistance ratio at 23° C. after heat cycling the conductors, of one particular system, to about 85° C., 110° C. and 145° C., respectively was approximately 3.5, 6.5 and 10% of the original ratio. The main benefit of the field shaper from the thermal point of view is to limit the temperature of the cable system during emergency loading.

The design of the proposed field shaper used in a pipe-type cable system ranges from using a single layer of split rings to a multilayer construction, depending on the cable system design and configuration and on the operating conditions of the system. Therefore, for any particular application the number of layers, dimensions and material of the rings in each layer can be selected to meet the loss reduction and economic criteria established for the operation of the system.

While the invention has its most important applications to pipe-type cable systems, it is not limited to such systems. The invention is broadly applicable to the case of an electrical cable system for transmitting alternating current at power frequency and comprising a metallic conduit providing a longitudinally extending channel and housing a group of individually insulated conductors extending side by side along the channel. The conduit may be a closed pipe having a continuous inner wall, or it may be an open-topped tray-like conduit. In the latter case the metallic liner interposed between the conductors and the conduit wall is axially laminated, that is to say, it consists of an assembly of transverse liner segments which abut end to end, thereby forming an axially laminated eddy current shield. Preferably, where the conduit is of ferromagnetic material such as steel, the liner is of highly conductive nonferromagnetic material such as aluminium or copper.

Based on the foregoing information, the benefits of using the invention are at a maximum for high capacity systems with large cables arranged in cradle formation in pipes made of ferromagnetic material. However, the total loss reduction achieved for any cable systems housed in metallic enclosures is much larger than the reductions achieved with other known methods.

What we claim is:

1. In an electrical cable system for transmitting alternating current at power frequency, the system comprising a group of individually insulated conductors extending side by side within a metallic conduit, the conduit having a continuous interior wall and the conductors being disposed eccentrically within the conduit adjacent a first longitudinally extending region of said inner wall, a metallic first liner interposed between the conductors and said wall, the first liner having a longitudinal slot extending throughout its length, the slot being disposed adjacent a second longitudinally extending region of said wall opposite the first region.

2. An electrical cable system according to claim 1, wherein the first liner is of ferromagnetic material, said slot defining a region of concentrated magnetic flux.

3. An electrical cable system according to claim 1, wherein the first liner is of nonferromagnetic material.

4. An electrical cable system according to claim 1, wherein the first liner is constituted by a series of split rings abutting end to end and insulated from one another, the splits of the rings being longitudinally aligned to define said slot.

5. An electrical cable system according to claim 4, further comprising a second liner interposed between the first liner and said inner wall, the second liner consisting of a series of metallic rings abutting end to end and insulated from one another.

6. An electrical cable system according to claim 5, wherein the rings of said first and second liners are staggered longitudinally in relation to one another.

7. An electrical cable system for transmitting alternating current at power frequency, the system comprising a metallic conduit having a continuous inner wall, a group of individually insulated conductors extending side by side within the conduit, the conductors being disposed eccentrically within the conduit adjacent a first longitudinally extending region of said inner wall, a first metallic liner interposed between the conductors and said inner wall, a second metallic liner interposed between the first liner and said inner wall, said second liner consisting of a series of closed rings abutting end to end and insulated from one another, and said first liner having a longitudinal slot extending throughout its length, the slot being disposed adjacent a second region of said inner wall opposite the first region.

8. An electrical cable system according to claim 7, further comprising at least one additional metallic liner interposed between the second liner and said wall, said at least one additional metallic liner consisting of a series of rings abutting end to end and insulated from one another, the rings of said second and at least one additional liner being staggered longitudinally in relation to one another.

9. An electrical cable system according to claim 7, wherein the first metallic liner is of ferromagnetic material and the second metallic liner is of nonferromagnetic material.

10. An electrical cable system according to claim 7, wherein the conductors are disposed in a cradle configuration.

11. An electrical cable system according to claim 7, wherein the conductors are disposed in a triangular configuration.

12. An electrical cable system for transmitting alternating current at power frequency, the system comprising a tubular metallic conduit, a group of individually insulated conductors extending side by side within the conduit, the conductors being loosely disposed eccentrically within the conduit adjacent a first longitudinally extending region of the conduit wall, and means for modifying the electromagnetic field induced by current flowing in the conductors and secondary currents induced thereby, said means comprising first liner means interposed between the conductors and said wall, second liner means interposed between the first liner means and said wall, said first liner means comprising at least one metallic liner member of ferromagnetic material having a longitudinal slot extending throughout its length, the slot being positioned to extend along a second region of the conduit wall opposite the first region, and said second liner means comprising at least one layer of closed metallic rings abutting end to end and insulated from one another.

13. An electrical cable system according to claim 12, wherein said first liner means comprises a plurality of said liner members arranged concentrically one within another, the slots of said liner member being staggered circumferentially in relation to one another.

14. An electrical cable system according to claim 12, wherein said second liner means comprises a plurality of said layers of closed metallic rings, the rings of adjacent layers being staggered longitudinally in relation to one another.

15. An electrical cable system for transmitting alternating current at power frequency, the system comprising a metallic conduit providing a longitudinally extending channel housing a group of individually insulated conductors extending side by side along the channel, and a metallic liner interposed between the conductors and the inner wall of the conduit, the liner comprising first and second liner members arranged concentrically one within the other, at least one said liner member comprising an assembly of transverse liner segments abutting end to end thereby forming an axially and radially laminated eddy current shield.

16. An electrical cable system according to claim 15, wherein the conduit is of ferromagnetic material.

17. An electrical cable system according to claim 16, wherein the liner is of highly conductive non-ferromagnetic material.

18. An electrical cable system according to claim 15, wherein the conduit is a closed pipe having a continuous wall.

19. An electrical cable system for transmitting alternating current at power frequency, the system comprising a metallic conduit providing a longitudinally extending channel housing a group of individually insulated conductors extending side by side along the channel, and a metallic liner assembly interposed between the conductors and the conduit wall, the liner assembly comprising a plurality of layers of closed metallic rings, the rings of each layer being staggered longitudinally in relation to one another thereby forming an axially and radially laminated eddy current shield.

* * * * *